United States Patent
Saitoh et al.

(10) Patent No.: US 10,847,600 B2
(45) Date of Patent: Nov. 24, 2020

(54) DISPLAY DEVICE AND MANUFACTURING METHOD FOR DISPLAY DEVICE

(71) Applicant: Sharp Kabushiki Kaisha, Sakai, Osaka (JP)

(72) Inventors: Takao Saitoh, Sakai (JP); Masaki Yamanaka, Sakai (JP); Yohsuke Kanzaki, Sakai (JP); Seiji Kaneko, Sakai (JP); Masahiko Miwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/466,360

(22) PCT Filed: Jul. 28, 2017

(86) PCT No.: PCT/JP2017/027477
§ 371 (c)(1),
(2) Date: Jun. 4, 2019

(87) PCT Pub. No.: WO2019/021466
PCT Pub. Date: Jan. 31, 2019

(65) Prior Publication Data
US 2020/0066821 A1 Feb. 27, 2020

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01); *H01L 2227/323* (2013.01); *H01L 2251/5315* (2013.01)

(58) Field of Classification Search
None
See application file for complete search history.

(56) References Cited

U.S. PATENT DOCUMENTS

| 2016/0268542 A1 | 9/2016 | Suzuki |
| 2017/0040406 A1 | 2/2017 | Park et al. |

(Continued)

FOREIGN PATENT DOCUMENTS

| JP | 2002-299773 A | 10/2002 |
| JP | 2008-233452 A | 10/2008 |

(Continued)

OTHER PUBLICATIONS

Official Communication issued in International Patent Application No. PCT/JP2017/027477, dated Oct. 31, 2017.

*Primary Examiner* — Raj R Gupta
(74) *Attorney, Agent, or Firm* — Keating & Bennett, LLP

(57) ABSTRACT

A display device including a resin layer, and a TFT layer being an upper layer with respect to the resin layer, wherein a bending section is provided on a peripheral edge, includes a terminal wiring line that is connected to a terminal in the TFT layer and passes through the bending section, and the terminal wiring line includes a first wiring line and a second wiring line that are positioned on both sides of the bending section, a third wiring line that passes through the bending section and is electrically connected with each of the first wiring line and the second wiring line, and a fourth wiring line that is formed in a layer different from that of the third wiring line and is electrically connected with each of the first wiring line and the second wiring line.

20 Claims, 12 Drawing Sheets

(56) References Cited

U.S. PATENT DOCUMENTS

| | | |
|---|---|---|
| 2017/0148702 A1 | 5/2017 | Funayama et al. |
| 2017/0194411 A1 | 7/2017 | Park et al. |
| 2018/0145125 A1* | 5/2018 | Lee .................... H01L 27/3262 |
| 2018/0173033 A1 | 6/2018 | Suga |

FOREIGN PATENT DOCUMENTS

| | | |
|---|---|---|
| JP | 2016-170266 A | 9/2016 |
| JP | 2017-097163 A | 6/2017 |
| WO | 2016/204056 A1 | 12/2016 |

* cited by examiner

DISPLAY DEVICE AND MANUFACTURING METHOD FOR DISPLAY DEVICE

TECHNICAL FIELD

The disclosure relates to a display device.

BACKGROUND ART

PTL 1 discloses configuration in which a peripheral area of a display device is bent.

CITATION LIST

Patent Literature

PTL 1: JP 2016-170266 A (published on Sep. 23, 2016)

SUMMARY

Technical Problem

When a bending section is formed in the peripheral edge of the display device, a terminal wiring line passing through the bending section might be broken.

Solution to Problem

A display device according to one aspect of the disclosure, including a resin layer and a TFT layer being an upper layer with respect to the resin layer, wherein a bending section is provided on a peripheral edge, includes a terminal wiring line configured to be connected to a terminal of the TFT layer and configured to pass through the bending section, wherein the terminal wiring line includes a first wiring line and a second wiring line configured to be positioned on both sides of the bending section, a third wiring line configured to pass through the bending section and be electrically connected with each of the first wiring line and the second wiring line, and a fourth wiring line configured to be formed in a layer different from a layer of the third wiring line and be electrically connected with each of the first wiring line and the second wiring line.

Advantageous Effects of Disclosure

According to one aspect of the disclosure, a possibility that the terminal wiring line passing through the bending section is broken is reduced.

BRIEF DESCRIPTION OF DRAWINGS

FIG. 4A is a top view, FIG. 4B is a cross-sectional view taken along line A-A', and FIG. 4C is a cross-sectional view taken along line B-B'.

FIG. 8A is a top view, FIG. 8B is a cross-sectional view taken along line A-A', and FIG. 8C is a cross-sectional view taken along line B-B'.

DESCRIPTION OF EMBODIMENTS

Figure 1:
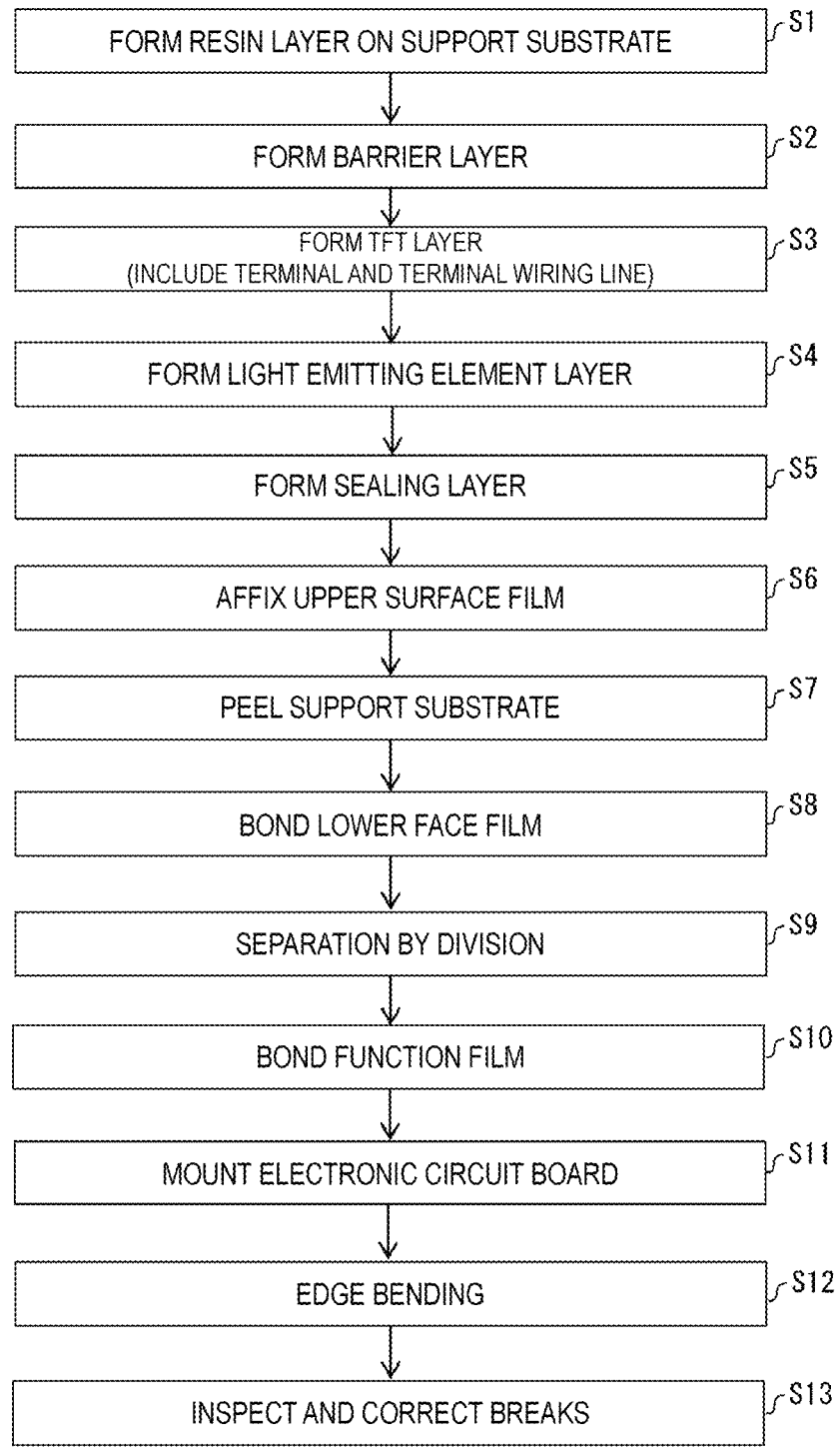
FIG. 1 is a flowchart illustrating an example of a manufacturing method of a display device.
Figure 2:
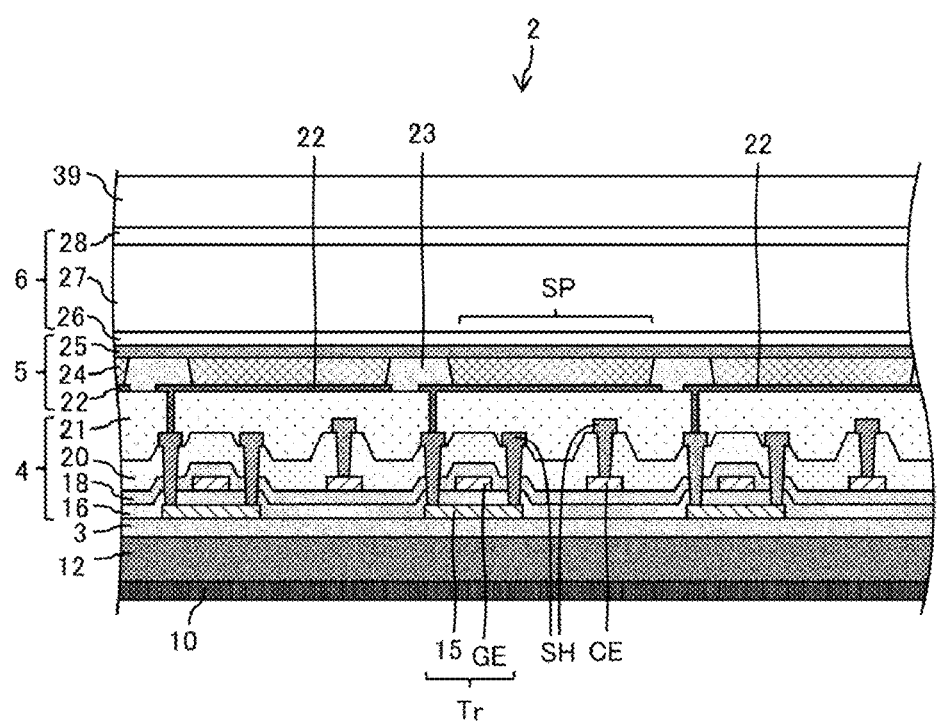
FIG. 2 is a cross-sectional view illustrating a configuration example of a display section of the display device.
Figure 3:
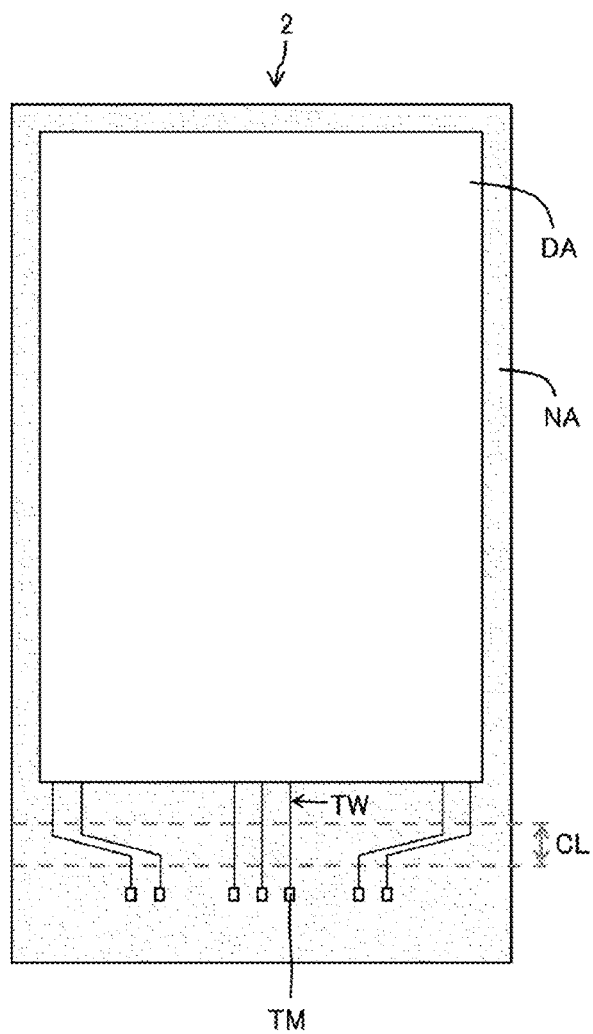
FIG. 3 is a plan view illustrating a configuration example of the display device.

FIG. 1 is a flowchart illustrating an example of a manufacturing method of a display device. FIG. 2 is a cross-sectional view illustrating a configuration example of a display section of the display device. FIG. 3 is a plan view illustrating a configuration example of the display device. Hereinafter, "same layer" means being formed of an identical material in an identical process, and "lower layer" means being formed in a prior process with respect to that of a layer to be compared, and "upper layer" means being formed in a posterior process with respect to that of a layer to be compared.

When a flexible display device is manufactured, as illustrated in FIGS. 1 to 3, first, a resin layer 12 is formed on a transparent support substrate (for example, a mother glass substrate) (Step S1). Next, a barrier layer 3 is formed (Step S2). Next, a TFT layer 4 including terminals TM and terminal wiring lines TW is formed (Step S3). Next, a light-emitting element layer (for example, an OLED element layer) 5 of a top-emitting type is formed (Step S4). Next, a sealing layer 6 is formed (Step S5). Next, an upper face film is bonded to the sealing layer 6 (Step S6).

Next, the lower face of the resin layer 12 is irradiated with laser light through the support substrate, thereby reducing bonding strength between the support substrate and the resin layer 12 and peeling the support substrate off the resin layer 12 (Step S7). Next, a lower face film 10 is bonded to the lower face of the base layer 12 (Step S8). Next, a layered body including the lower face film 10, the resin layer 12, the barrier layer 3, the TFT layer 4, the light-emitting element layer 5, and the sealing layer 6 is divided into a plurality of individual pieces (Step S9). Next, a function film 39 is bonded to the acquired individual pieces (Step S10). Next, an electronic circuit board (for example, IC chip) is mounted on a terminal for external connection (Step S11). Next, an edge bending (process for bending a bending section CL in FIG. 3 by 180 degrees) is applied, thereby forming a display device 2 (Step S12). Next, inspection for breaks is performed, and in a case where a break is present, correction is made (Step S13). Note that each of the above-described steps is performed by a display device manufacturing apparatus described later.

Examples of the material of the resin layer 12 include polyimide, epoxy, and polyamide. Examples of the material of the lower face film 10 include polyethylene terephthalate (PET).

The barrier layer 3 is a layer that inhibits moisture or impurities from reaching the TFT layer 4 or the light-emitting element layer 5 when the display device is being used, and can be constituted by a silicon oxide film, a silicon nitride film, or a silicon oxynitride film, or by a layered film of these, formed using CVD, for example.

The TFT layer 4 includes a semiconductor film 15, an inorganic insulating film 16 (a gate insulating film) that is formed above the semiconductor film 15, a gate electrode GE that is formed above the inorganic insulating film 16, an inorganic insulating film 18 that is formed above the gate electrode GE, capacitance wiring line CE that is formed above the inorganic insulating film 18, an inorganic insulating film 20 that is formed above the capacitance wiring line CE, source wiring lines SH and terminals TM that are formed above the inorganic insulating film 20, and a flattening film 21 that is formed above the source wiring lines SH and the terminals TM.

A thin film transistor (TFT) Tr is configured to include the semiconductor film 15, the inorganic insulating film 16 (the gate insulating film), and the gate electrode GE.

In a non-active region NA of the TFT layer 4, the terminals TM that are used for connection with an electronic circuit board, such as an IC chip and an FPC, and the terminal wiring lines TW (described later in detail) that connect the terminals TM with wiring lines in an active area DA, and the like are formed.

The semiconductor film 15 is formed of, for example, low-temperature polysilicon (LTPS) or an oxide semiconductor. Note that, FIG. 2 illustrates the TFT that has a top gate structure in which the semiconductor film 15 is the channel, but the TFT may have a bottom gate structure (when the TFT channel is the oxide semiconductor, for example).

The gate electrode GE, a capacitance electrode CE, the source wiring line SH, the terminal wiring line TW, and the terminals TM are each constituted by a single-layer metal film or a layered metal film including at least one of aluminum (Al), tungsten (W), molybdenum (Mo), tantalum (Ta), chromium (Cr), titanium (Ti), and copper (Cu), for example.

The inorganic insulating films 16, 18, and 20 can be constituted by a silicon oxide (SiOx) film or a silicon nitride (SiNx) film, or a layered film of these, formed using CVD, for example.

The flattening film (interlayer insulating film) 21 can be constituted, for example, by a coatable photosensitive organic material, such as a polyimide or an acrylic.

The light-emitting element layer (for example, an organic light-emitting diode layer) 5 includes an anode 22 that is formed in a layer above the flattening film 21, a bank 23 that covers the edge of the anode 22, an electroluminescence (EL) layer 24 that is formed in a layer above the anode 22, a cathode 25 that is formed in a layer above the EL layer 24, and for each subpixel, a light-emitting element (for example, OLED: an organic light-emitting diode) that includes the insular anode 22, the EL layer 24, and the cathode 25, and a sub-pixel circuit for driving this are provided. The bank 23 (anode edge cover) can be formed of, for example, a coatable photosensitive organic material such as polyimide or acrylic, for example.

For example, the organic EL layer 24 is formed by layering a hole injection layer, a hole transport layer, a light-emitting layer, an electron transport layer, and an electron injection layer in the order from the lower layer side. The light-emitting layer is formed for each subpixel in an insular shape by a vapor deposition method or an ink-jet method, but other layers can be provided as a flat common layer. In addition, it is possible to have configuration in which one or more layers out of the hole injection layer, the hole transport layer, the electron transport layer, and the electron injection layer are not formed.

The anode (anode) 22 is formed by layering indium tin oxide (ITO) and an alloy containing Ag, for example, and has light reflectivity (to be described below in more detail). The cathode 25 can be constituted by a light-transmissive conductive material such as indium tin oxide (ITO) and indium zinc oxide (IZO).

In the case that the light-emitting element layer 5 is the OLED layer, positive holes and electrons are recombined inside the EL layer 24 by a drive current between the anode 22 and the cathode 25, and light is emitted as a result of excitons that are generated by the recombination falling into a ground state. Since the cathode 25 is light-transmissive and the anode 22 is light-reflective, the light emitted from the EL layer 24 travels upward and results in top emission.

The light-emitting element layer 5 is not limited to OLED element configurations, and may be an inorganic light-emitting diode or a quantum dot light-emitting diode.

The sealing layer 6 is light-transmissive, and includes a first inorganic sealing film 26 that covers the cathode 25, an organic sealing film 27 that is formed above the first inorganic sealing film 26, and a second inorganic sealing film 28 that covers the organic sealing film 27. The sealing layer 6 covering the light-emitting element layer 5 prevents foreign matters, such as water and oxygen, from infiltrating into the light-emitting element layer 5.

The first inorganic sealing film 26 and the second inorganic sealing film 28 can be each constituted by a silicon oxide film, a silicon nitride film, or a silicon oxynitride film, or by a layered film of these, formed using CVD. The organic sealing film 27 is thicker than the first inorganic sealing film 26 and the second inorganic sealing film 28, is a light-transmissive organic film, and can be constituted by a coatable photosensitive organic material such as a polyimide or an acrylic.

After the support substrate has been peeled off, the lower face film 10 is bonded to the lower face of the resin layer 12, thereby achieving a display device having excellent flexibility, and examples of a material of the lower face film 10 include PET and the like. The function film 39 includes, for example, an optical compensation function, a touch sensor function, a protection function, and the like.

Thereinbefore, the explanation has been given for a case of manufacturing the flexible display device, but when a non-flexible display device is manufactured, replacement of the substrate and the like is not required, and thus the processing may proceed from Step S5 to Step S9 illustrated in FIG. 1, for example.

First Embodiment

Figure 4A:
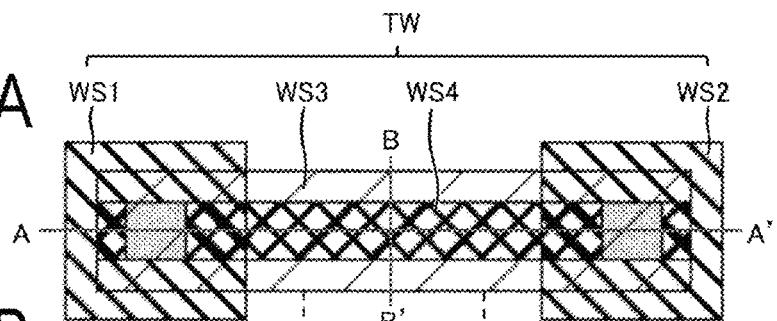
FIGS. 4A to 4C are views illustrating configuration of a non-active area of a first embodiment.
Figure 4B:
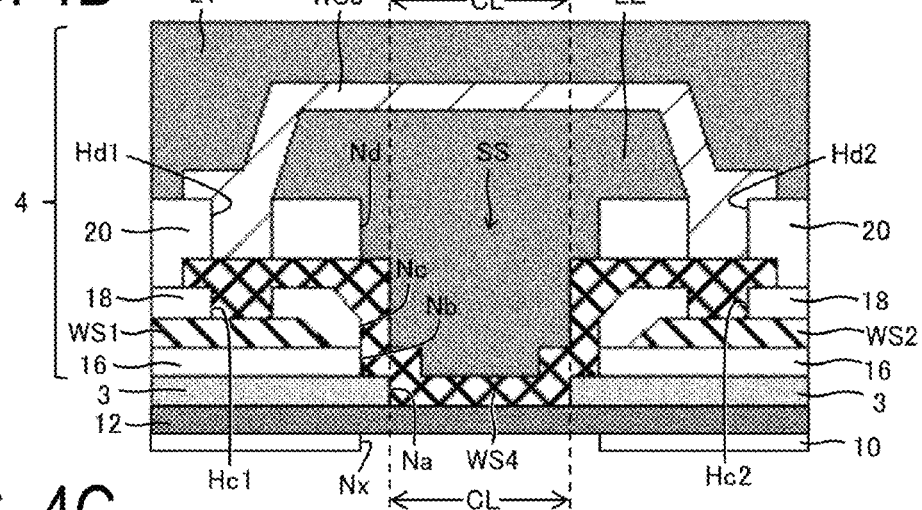
Figure 4C:
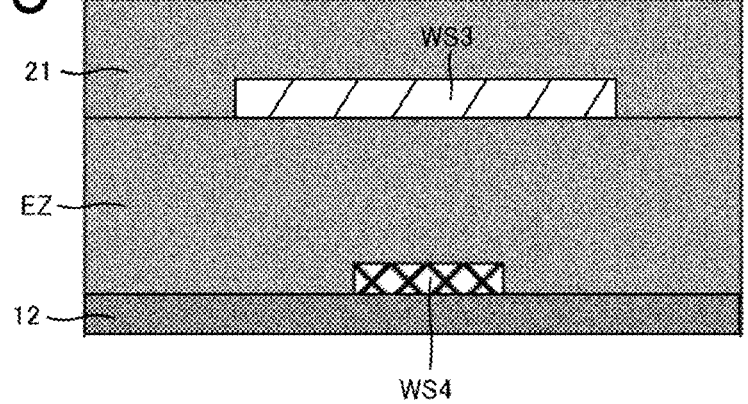
Figure 5:
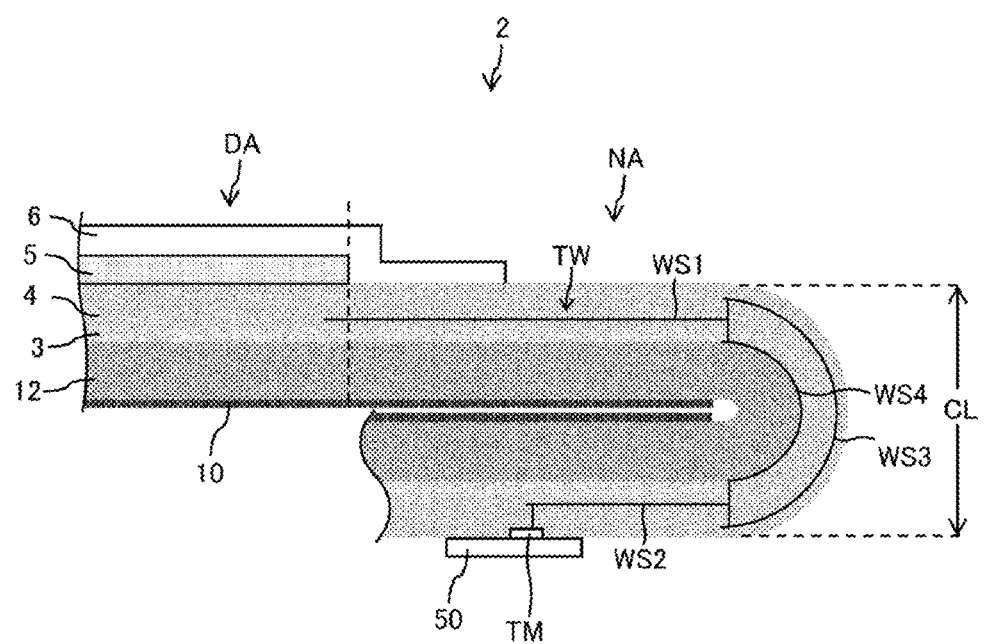
FIG. 5 is a cross-sectional view illustrating configuration of the bending of a non-display area of the display device.

FIGS. 4A to 4C are views illustrating configuration of a peripheral edge of a display device of a first embodiment, and FIG. 4A is a top view, FIG. 4B is a cross-sectional view taken along line A-A', and FIG. 4C is a cross-sectional view taken along line B-B'. FIG. 5 is a cross-sectional view illustrating configuration of the bending of a non-active area of the display device.

As illustrated in FIGS. 4A to 5, the peripheral edge (non-display area) NA of the display device 2 includes the lower face film 10, the resin layer 12, the barrier layer 3, the inorganic insulating films 16, 18, and 20, a reinforcing film EZ, the flattening film 21 that serves as an underlayer of the light-emitting element layer 5, the terminal wiring lines TW, and the terminals TM, and the bending section CL is provided on the peripheral edge NA. The terminal TM is connected to the display area DA by the terminal wiring line TW passing through the bending section CL. The reinforcing film EZ, for example, can be constituted, for example, by a coatable photosensitive organic material, such as a polyimide or an acrylic and formed on an upper layer with respect to the inorganic insulating film 20 and on a lower layer with respect to the flattening film 21. As illustrated in FIG. 5, the display device 2 is bent by 180 degrees at the bending section CL, thereby connecting the terminal TM disposed on the lower face side and an electronic circuit board 50 (IC chip or flexible printed circuit board).

As illustrated in FIG. 4, the lower face film 10, the barrier layer 3, and the inorganic insulating films 16, 18, and 20 are penetrated in the bending section CL. Specifically, a penetration section Nx is formed in the lower face film 10, and a penetration section Na is formed in the barrier layer 3, and a penetration section Nb is formed in the inorganic insulating film 16 (a first insulating film), and a penetration section Nc is formed in the inorganic insulating film 18 (a second insulating film), and a penetration section Nd is formed in the inorganic insulating film 20 (a third insulating film), and in a planar view, the penetration sections Nx, Nb, Nc, and Nd are aligned, and the penetration section Na aligned to the bending section CL is positioned on the inside of the penetration sections Nx, Nb, Nc, and Nd. A fourth wiring line WS4 passes through the penetration section Na (first slit) and the penetration sections Nb, Nc, and Nd (second slit SS), and the reinforcing film EZ is provided in a space formed by the penetration section Na (first slit) and the penetration sections Nb, Nc, and Nd (second slit SS).

The terminal wiring line TW includes a first wiring line WS1 and a second wiring line WS2 positioned on both sides of the bending section CL, and a third wiring line WS3 that passes through the bending section CL and electrically connects to each of the first wiring line WS1 and the second wiring line WS2, and the fourth wiring line WS4 that is superimposed on the third wiring line WS3 via the reinforcing film EZ (flexible insulating film) and electrically connected to each of the first wiring line WS1 and second wiring line WS2.

Specifically, the first wiring line WS1 and the second wiring line WS2 are formed on the same layer as that of the gate electrode GE (see FIG. 2), and the third wiring line WS3 is formed on the same layer as that of the source wiring lines SH (see FIG. 2) and the terminals TM included in the TFT layer 4, and the fourth wiring line WS4 is formed on the same layer as that of the capacitance wiring lines CE (see FIG. 2) (formed on the lower layer with respect to the terminals TM and the upper layer with respect to the capacitance wiring lines CE). The third wiring line WS3 is wider in width than the fourth wiring line WS4, and the fourth wiring line WS4 is positioned in the edge of the third wiring lines WS3.

The third wiring line WS3 is led from one side of the bending section CL to the other side of the bending section CL over the reinforcing film EZ, and sandwiched between the reinforcing film EZ and the flattening film 21 in the bending section CL. The fourth wiring line WS4 is led from one side of the bending section CL to the other side of the bending section CL through the penetration sections Na, Nb, and Nc and sandwiched between the resin layer 12 and the reinforcing film EZ in the bending section CL. The reinforcing film EZ and the flattening film 21 may be formed of the same organic material (e.g., polyimide).

As for the fourth wiring line WS4, one end thereof is connected to the first wiring line WS1 by a contact hole Hc1 formed in the inorganic insulating film 18 and connected to one end of the third wiring line WS3 by a contact hole Hd1 formed in the inorganic insulating film 20. As for the fourth wiring line WS4, the other end thereof is connected to the second wiring line WS2 by a contact hole Hc2 formed in the inorganic insulating film 18 and connected to the other end of the third wiring line WS3 by a contact hole Hd2 formed in the inorganic insulating film 20.

In a planar view, the opening of the penetration section Na (first slit) is disposed on the inside of the opening of the second slit SS formed of the penetration sections Na, Nc, and Nd, and the fourth wiring line WS4 is in contact with the barrier layer 3 in the second slit SS.

Figure 6:
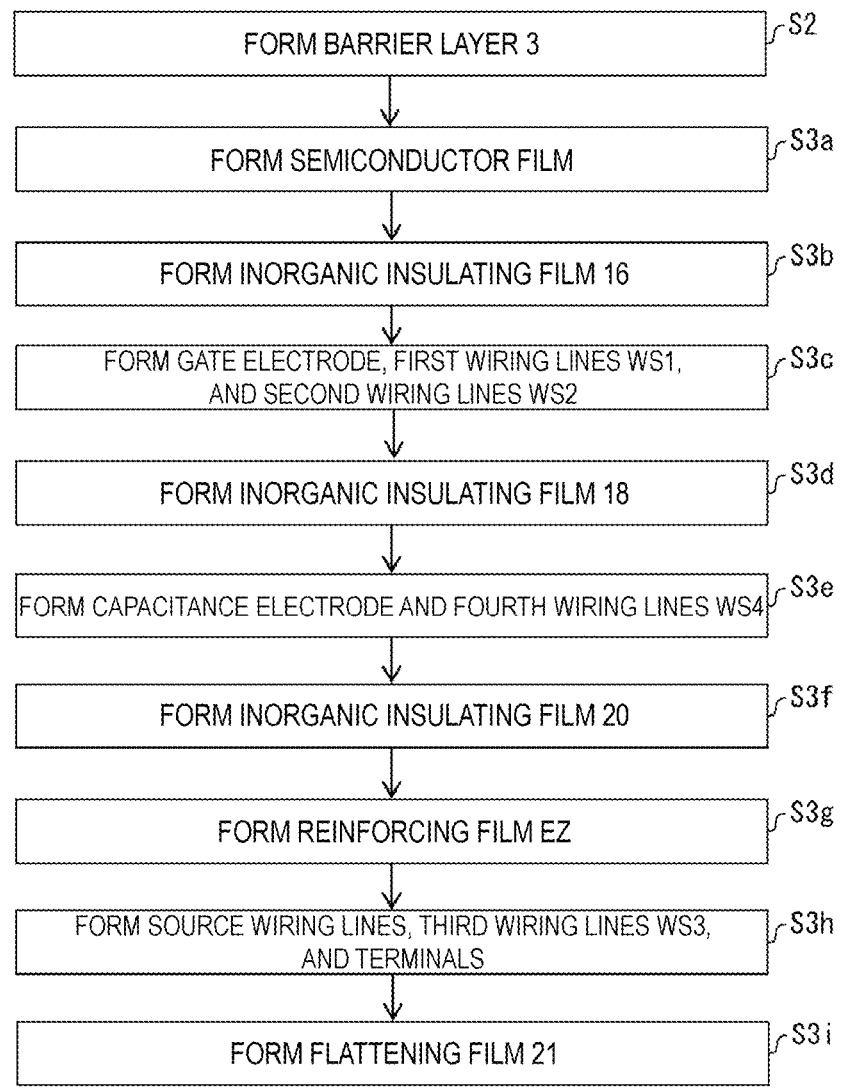
FIG. 6 is a flowchart illustrating an example of the formation of a TFT layer of the first embodiment.

FIG. 6 is a flowchart illustrating an example of the formation of a TFT layer of the first embodiment. Subsequent to Step S1 in FIG. 1, the barrier layer 3 is formed at Step S2. At the next Step S3a, the semiconductor film 15 (see FIG. 2) is formed. At the next Step S3b, the inorganic insulating film 16 is formed. At the next Step S3c, the gate electrode, the first wiring lines WS1, and the second wiring lines WS2 are formed. At the next Step S3d, the inorganic insulating film 18 is formed. At the next Step S3e, the capacitance electrode CE (see FIG. 2) and the fourth wiring line WS4 are formed. At the next Step S3f, the inorganic insulating film 20 is formed. At the next Step S3g, the reinforcing film EZ is formed. At the next Step S3h, the source wiring lines SH (see FIG. 2), the third wiring lines WS3, and the terminals TM are formed. At the next Step S3i, the flattening film 21 is formed (see FIG. 1 for subsequent processes onward). Note that the formation (patterning) of the penetration sections Nb and Nc may be performed in successive processes.

Figure 7:
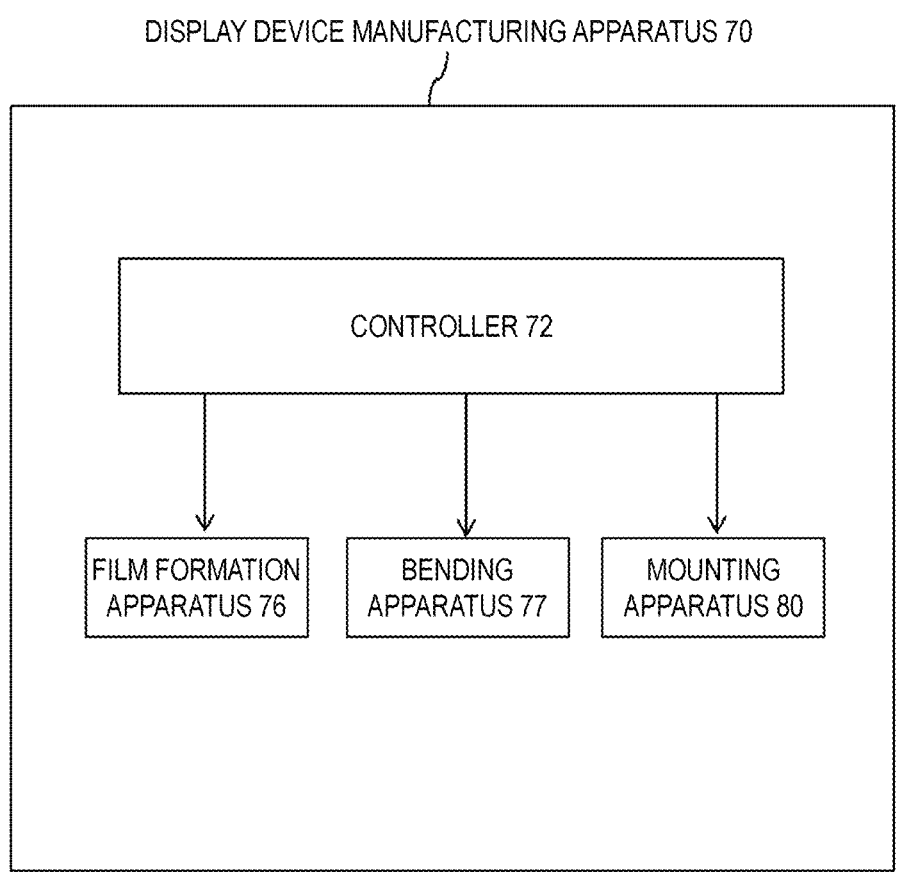
FIG. 7 is a block diagram illustrating configuration of a display device manufacturing apparatus.

FIG. 7 is a block diagram illustrating configuration of a display device manufacturing apparatus. As illustrated in FIG. 7, a display device manufacturing apparatus 70 includes a film formation apparatus 76, a bending apparatus 77, a mounting apparatus 80, and a controller 72 for controlling these apparatuses, and the film formation apparatus 76 performs Steps S3a to S3i in FIG. 6, the bending apparatus 77 performs Step S10 in FIG. 1, and the mounting apparatus 80 performs Step S12 in FIG. 1.

In the first embodiment, the terminal wiring line TW includes the third wiring line WS3 and the fourth wiring line WS4 passing through the bending section CL, so that even when the third wiring line WS3 is broken, electrical channel from the first wiring line WS1 to the second wiring line WS2 can be maintained with the fourth wiring line WS4, and a possibility that the terminal wiring line TW might be broken in the bending section is reduced.

In addition, the barrier layer 3 and the inorganic insulating films 16, 18, and 20 (which are closely-packed and solid) formed using CVD are penetrated in the bending section CL, so that stress in bending the bending section CL is reduced, and the breaks of the third wiring lines WS3 and the fourth wiring lines are unlikely to occur.

In addition, the third wiring lines WS3 and the fourth wiring lines WS4 in the bending section CL are each sandwiched between organic materials formed of a coating that is high in flexibility compared to the inorganic materials formed using CVD, so that the breaks of the third wiring lines WS3 and the fourth wiring lines WS4 are unlikely to occur.

Second Embodiment

Figure 8A:
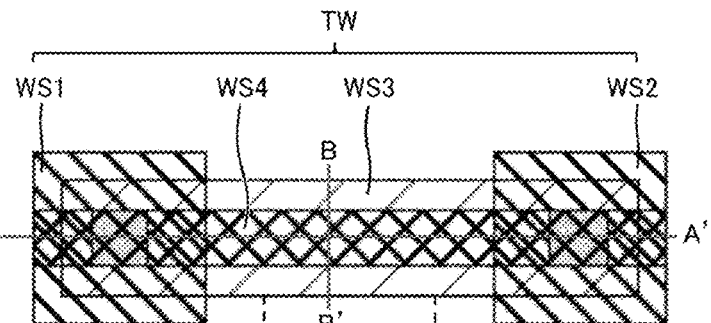
FIGS. 8A to 8C are views illustrating configuration of a non-display area of a second embodiment.
Figure 8B:
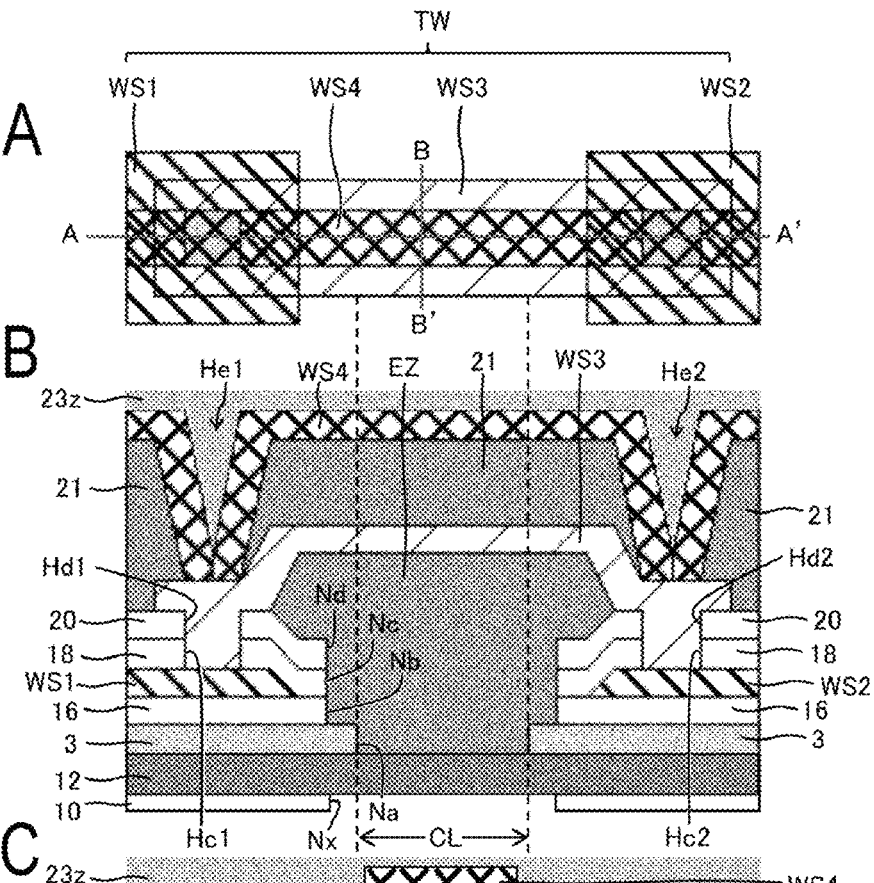
Figure 8C:
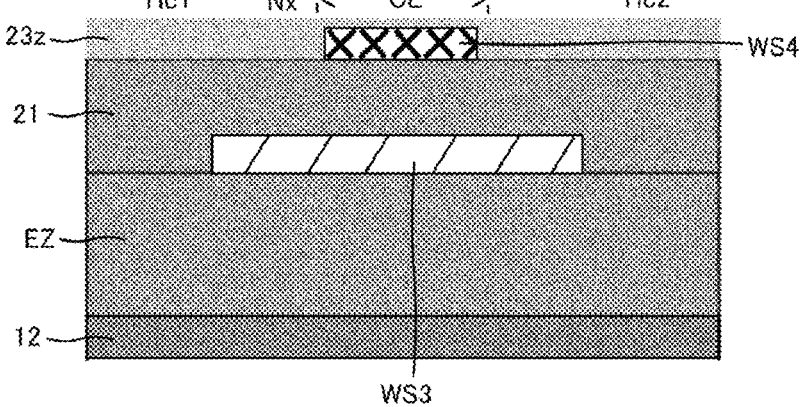
Figure 9:
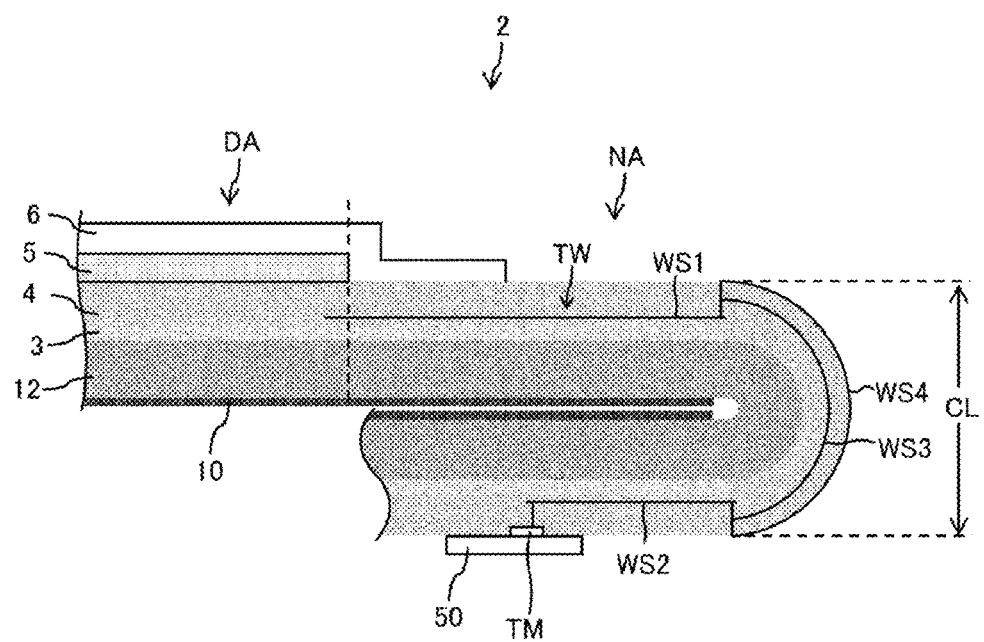
FIG. 9 is a cross-sectional view illustrating configuration of the bending of the non-display area of the display device.

In the first embodiment, the fourth wiring line WS4 is provided in the same layer as that of the capacitance wiring line, but not limited to this. FIGS. 8A to 8C are views illustrating a peripheral edge of a display device of a second embodiment, and FIG. 8A is a top view, FIG. 8B is a cross-sectional view taken along line A-A', and FIG. 8C is a cross-sectional view taken along line B-B'. FIG. 9 is a cross-sectional view illustrating an example of the bending of the non-active area of the display device.

As illustrated in FIGS. 8A to 9, the terminal wiring line TW of the second embodiment includes the first wiring line WS1 and the second wiring line WS2 positioned on both sides of the bending section CL, and the third wiring line WS3 that passes through the bending section CL and electrically connects to each of the first wiring line WS1 and the second wiring line WS2, and the fourth wiring line WS4 that is superimposed on the third wiring line WS3 via the flattening film 21 (flexible insulating film) and electrically connected to each of the first wiring line WS1 and second wiring line WS2.

Specifically, the first wiring line WS1 and the second wiring line WS2 are formed in the same layer as that of the gate electrodes GE (see FIG. 2) included in the TFT layer 4, and the third wiring line WS3 is formed in the same layer as that of the source wiring lines SH (see FIG. 2) and the terminals TM included in the TFT layer 4, and the fourth wiring line WS4 is formed in the same layer as that of the anode 22 of the light-emitting element layer 5 and formed of the same material. The third wiring line WS3 is wider in width than the fourth wiring line WS4, and the fourth wiring line WS4 is positioned in the edge of the third wiring line WS3.

The third wiring line WS3 is led from one side of the bending section CL to the other side of the bending section CL through the reinforcing film EZ, and sandwiched between the reinforcing film EZ and the flattening film 21 in the bending section CL. The fourth wiring line WS4 is led from one side of the bending section CL to the other side of the bending section CL through the flattening film 21 and sandwiched between the flattening film 21 and an organic insulating film 23z formed in the same layer as that of the bank (anode edge cover) 23. The reinforcing film EZ, the flattening film 21, and the organic insulating film 23z may be formed of the same organic material (e.g., polyimide).

The one end of the third wiring line WS3 is connected to one end of the first wiring line WS1 by a contact hole Hc1 formed in the inorganic insulating film 18 and a contact hole Hd1 formed in the inorganic insulating film 20 and communicating with the contact hole Hc1, and connected to the other end of the fourth wiring line WS4 by a contact hole He1 formed in the flattening film 21, and the other end of the third wiring line WS3 is connected to the second wiring line WS2 by a contact hole Hc2 formed in the inorganic insulating film 18 and a contact hole Hd2 formed in the inorganic insulating film 20 and communicating with the contact hole Hc2, and connected to the other end of the fourth wiring line WS4 by a contact hole He2 formed in the flattening film 21.

Figure 10:
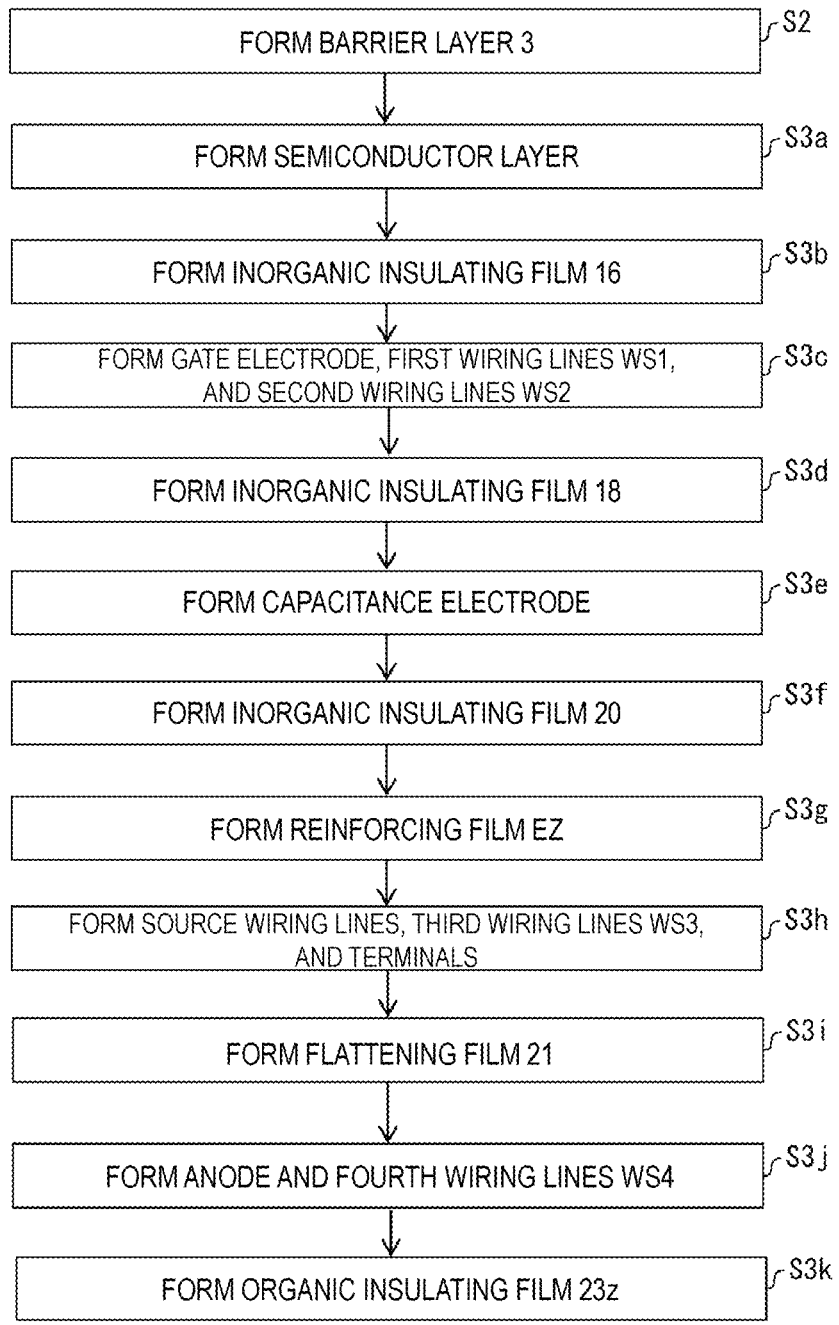
FIG. 10 is a flowchart illustrating an example of the formation of a TFT layer of the second embodiment.

FIG. 10 is a flowchart illustrating an example of the formation of a TFT layer of the second embodiment. Subsequent to Step S1 in FIG. 1, the barrier layer 3 is formed at Step S2. At the next Step S3a, the semiconductor film 15 (see FIG. 2) is formed. At the next Step S3b, the inorganic insulating film 16 is formed. At the next Step S3c, the gate electrode, the first wiring lines WS1, and the second wiring lines WS2 are formed. At the next Step S3d, the inorganic insulating film 18 is formed. At the next Step S3e, the capacitance electrode CE (see FIG. 2) is formed. At the next Step S3f, the inorganic insulating film 20 is formed. At the next Step S3g, the reinforcing film EZ is formed. At the next Step S3h, the source wiring lines SH (see FIG. 2), the third wiring lines WS3, and the terminals TM are formed. At the next Step S3i, the flattening film 21 is formed. At the next Step S3j, the anode 22 (see FIG. 2) and the fourth wiring lines WS4 are formed. At the next Step S3k, the organic insulating film 23z formed in the same layer as that of the bank 23 is formed (see FIG. 1 for subsequent processes onward). Note that the formation (patterning) of the penetration sections Nb, Nc and Nd may be performed in successive processes.

Third Embodiment

Figure 11A:
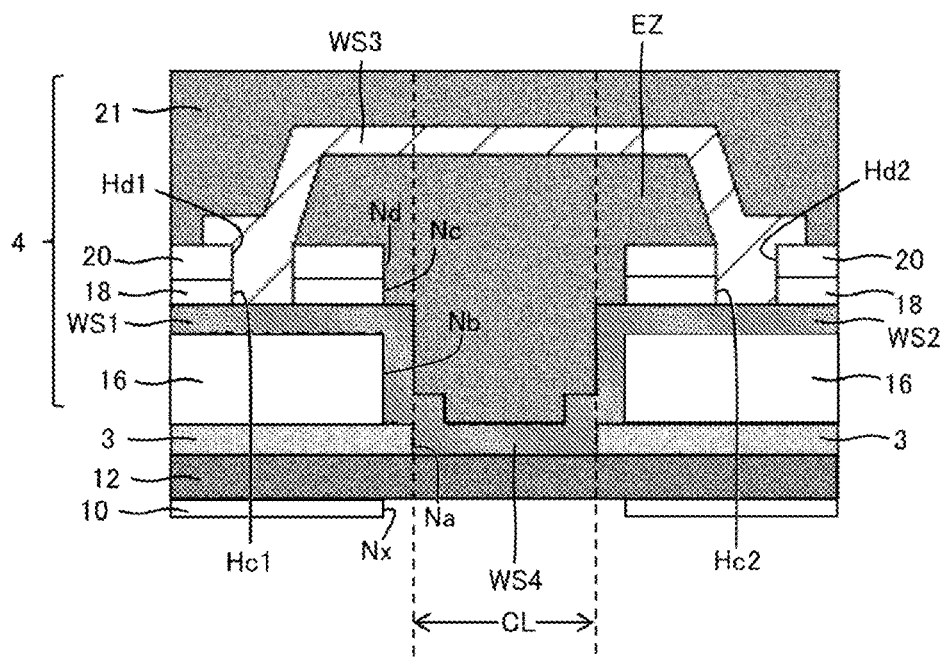
FIGS. 11A and 11B are cross-sectional views illustrating configuration of the non-display area of a third embodiment.
Figure 11B:
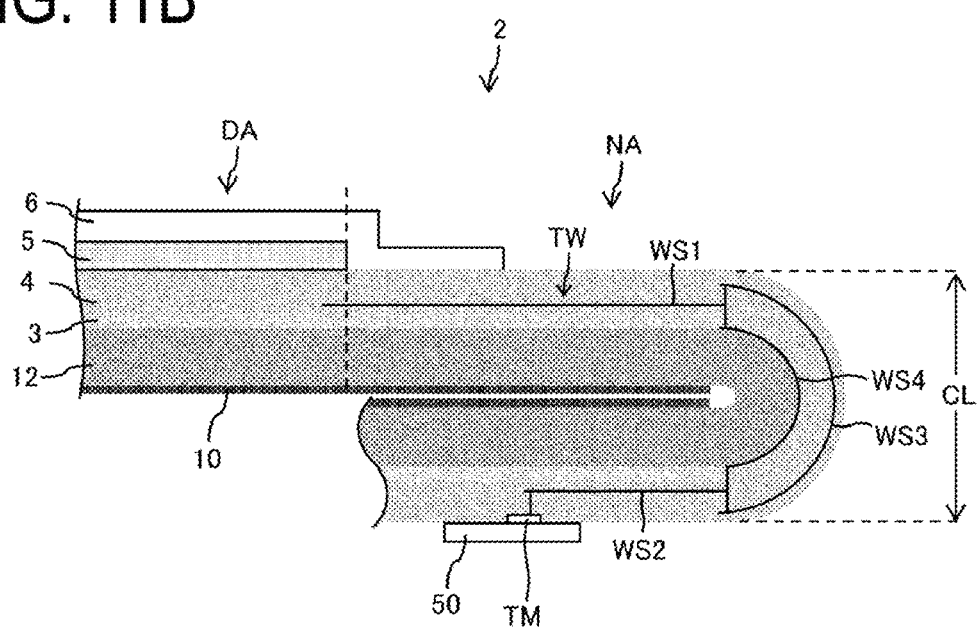

The fourth wiring lines WS4 may be provided in the same layer as that of the first wiring lines WS1, and the second wiring lines WS2. FIGS. 11A and 11B are cross-sectional views illustrating the peripheral edge of the display device of a third embodiment.

As illustrated in FIGS. 11A and 11B, the terminal wiring line TW of the third embodiment includes the first wiring line WS1 and the second wiring line WS2 positioned on both sides of the bending section CL, and the third wiring line WS3 that passes through the bending section CL and electrically connects to each of the first wiring line WS1 and the second wiring line WS2, and the fourth wiring line WS4 that is superimposed on the third wiring line WS3 via the reinforcing film EZ (flexible insulating film) and electrically connected to each of the first wiring line WS1 and the second wiring line WS2.

Specifically, the first wiring lines WS1, the second wiring lines WS2, and the fourth wiring lines WS4 are formed in the same layer as that of the gate electrodes GE (see FIG. 2) included in the TFT layer 4, and the third wiring lines WS3 are formed in the same layer as that of the source wiring lines SH (see FIG. 2) and the terminals TM included in the TFT layer 4.

The third wiring line WS3 is led from one side of the bending section CL to the other side of the bending section CL through the reinforcing film EZ, and sandwiched between the reinforcing film EZ and the flattening film 21 in the bending section CL. The fourth wiring line WS4 is led from one side of the bending section CL to the other side of the bending section CL through the penetration sections Na and Nb and sandwiched between the resin layer 12 and the reinforcing film EZ in the bending section CL. The reinforcing film EZ and the flattening film 21 may be formed of the same organic material (e.g., polyimide).

The one end of the third wiring line WS3 is connected to one end of the first wiring line WS1 and one end of the fourth wiring line WS4 by a contact hole Hc1 formed in the inorganic insulating film 18 and a contact hole Hd1 formed in the inorganic insulating film 20 and communicating with the contact hole Hc1, and the other end of the third wiring line WS3 is connected to the other ends of the second wiring line WS2 and the fourth wiring line WS4 by a contact hole Hc2 formed in the inorganic insulating film 18 and a contact hole Hd2 formed in the inorganic insulating film 20 and communicating with the contact hole Hc2.

Figure 12:
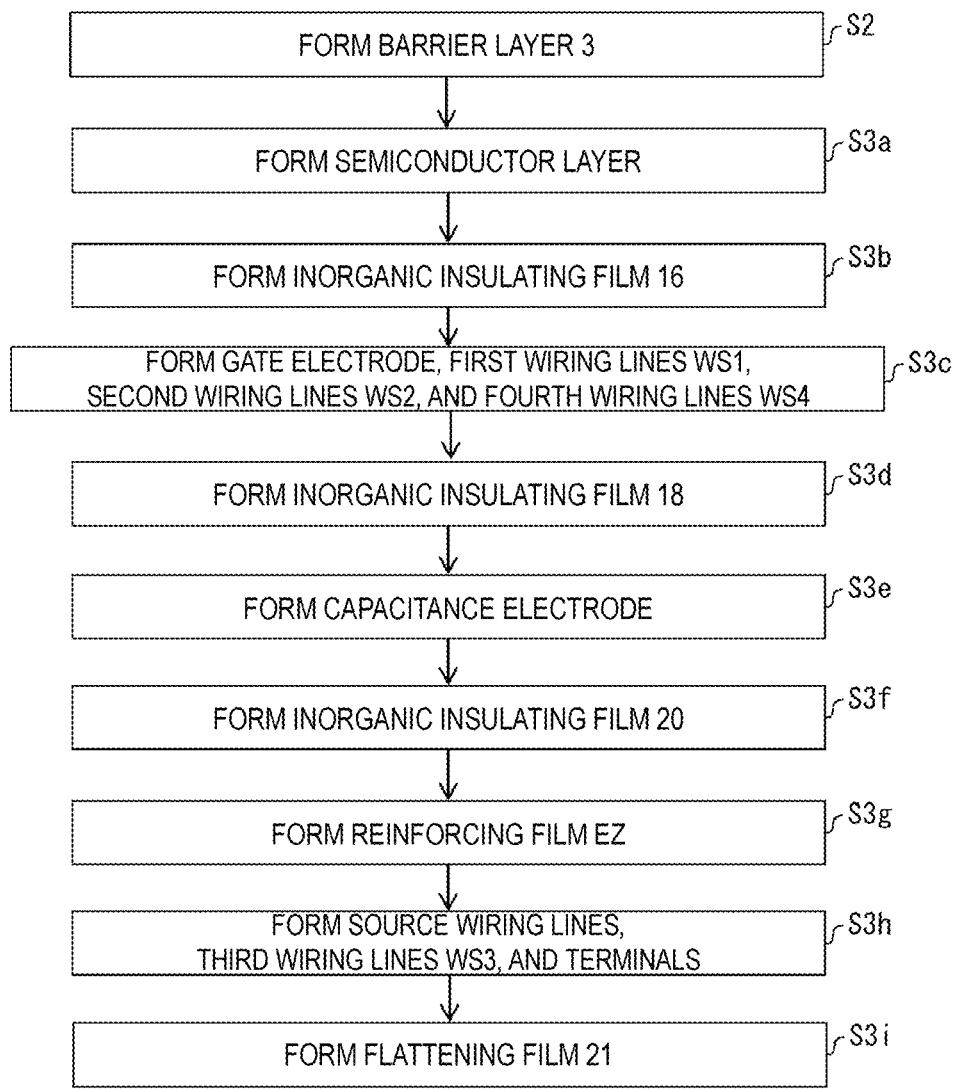
FIG. 12 is a flowchart illustrating an example of the formation of a TFT layer of the third embodiment.

FIG. 12 is a flowchart illustrating an example of the formation of a TFT layer of the third embodiment. Subsequent to Step S1 in FIG. 1, the barrier layer 3 is formed at Step S2. At the next Step S3a, the semiconductor film 15 (see FIG. 2) is formed. At the next Step S3b, the inorganic insulating film 16 is formed. At the next Step S3c, the gate electrode, the first wiring lines WS1, the second wiring lines WS2, and the fourth wiring lines WS4 are formed. At the next Step S3d, the inorganic insulating film 18 is formed. At the next Step S3e, the capacitance electrode CE (see FIG. 2)

is formed. At the next Step S3f, the inorganic insulating film 20 is formed. At the next Step S3g, the reinforcing film EZ is formed. At the next Step S3h, the source wiring lines SH (see FIG. 2), the third wiring lines WS3, and the terminals TM are formed. At the next Step S3i, the flattening film 21 is formed (see FIG. 1 for subsequent processes onward). Note that the formation (patterning) of the penetration sections Nc and Nd may be performed in successive processes.

Supplement

An electro-optical element (an electro-optical element whose luminance and transmittance are controlled by an electric current) that is provided in the display device according to the present embodiment is not particularly limited. Examples of the display device according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The disclosure is not limited to each of the embodiments stated above, and embodiments obtained by appropriately combining technical approaches stated in each of the different embodiments also fall within the scope of the technology of the disclosure. Moreover, novel technical features may be formed by combining the technical approaches stated in each of the embodiments.

First Aspect

A display device including a resin layer, a TFT layer being an upper layer with respect to the resin layer, and a light-emitting element layer being an upper layer with respect to the TFT layer, wherein a bending section is provided on a peripheral edge, includes a terminal wiring line configured to be connected to a terminal of the TFT layer and configured to pass through the bending section, and the terminal wiring line includes a first wiring line and a second wiring line configured to be positioned on both sides of the bending section, a third wiring line configured to pass through the bending section and be electrically connected with each of the first wiring line and the second wiring line, and a fourth wiring line configured to be formed in a layer different from a layer of the third wiring line and be electrically connected with each of the first wiring line and the second wiring line.

Second Aspect

The display device according to the first aspect is such that, for example, the fourth wiring line is superimposed on the third wiring line via a flexible insulating film.

Third Aspect

The display device according to the second aspect is such that, for example, a plurality of inorganic insulating films is included in the TFT layer, and the plurality of inorganic insulating films is penetrated in the bending section.

Fourth Aspect

The display device according to the third aspect, for example, includes a barrier layer between the resin layer and the TFT layer, and a first slit formed by penetrating the barrier layer is provided in the bending section.

Fifth Aspect

The display device according to the fourth aspect is such that, for example, a second slit formed by penetrating the plurality of inorganic insulating films overlaps the first slit, and a reinforcing film fills the first slit and the second slit.

Sixth Aspect

The display device according to the fifth aspect is such that, for example, the third wiring line is sandwiched between the reinforcing film and a flattening film serving as an underlayer of the light-emitting element layer in the bending section.

Seventh Aspect

The display device according to the sixth aspect is such that, for example, the reinforcing film and the flattening film are formed of an identical organic material.

Eight Aspect

The display device according to the sixth aspect is such that, for example, the third wiring line is formed in a same layer as a layer of the terminal.

Ninth Aspect

The display device according to the eighth aspect is such that, for example, the first wiring line and the second wiring line are formed in a same layer as a layer of a gate electrode included in the TFT layer.

Tenth Aspect

The display device according to the ninth aspect is such that, for example, the fourth wiring line is formed on an upper layer with respect to the gate electrode in the TFT layer and on a lower layer with respect to the terminal.

Eleventh Aspect

The display device according to the tenth aspect is such that, for example, the fourth wiring line passes through the first slit and the second slit.

Twelfth Aspect

The display device according to the eleventh aspect is such that, for example, the fourth wiring line and the resin layer are in contact with each other in the first slit.

Thirteenth Aspect

The display device according to the twelfth aspect is such that, for example, the fourth wiring line is sandwiched between the resin layer and the reinforcing film in the bending section.

Fourteenth Aspect

The display device according to the eleventh aspect is such that, for example, an opening of the first slit is disposed on an inside of an opening of the second slit in a planar view, and the fourth wiring line is in contact with the barrier layer in the second slit.

Fifteenth Aspect

The display device according to the eleventh aspect is such that, for example, the plurality of inorganic insulating films includes a first insulating film, a second insulating film, and a third insulating film, the third wiring line is formed on a same layer as a layer of a source electrode of the TFT layer, and the first insulating film is formed on an upper layer with respect to the barrier layer and on a lower layer with respect to the first wiring line and the second wiring line, the second insulating film is formed on an upper layer with respect to the first wiring line and the second wiring line and on a lower layer with respect to the fourth wiring line, the third insulating film is formed on an upper layer with respect to the fourth wiring line and on a lower layer with respect to the third wiring line, the first wiring line and the fourth wiring line come in contact with each other by one of two contact holes formed on the second insulating film on both sides of the bending section, the second wiring line and the fourth wiring line come in contact with each other by the other of the two contact holes, and the third wiring line and the fourth wiring line come in contact with each other by both two contact holes formed on the third insulating film on both sides of the bending section.

Sixteenth Aspect

The display device according to the ninth aspect is such that, for example, the fourth wiring line is formed on a same layer as a layer of a lower-side electrode included in the light-emitting element layer.

Seventeenth Aspect

The display device according to the sixteenth aspect is such that, for example, the fourth wiring line is sandwiched between the flattening film and an insulating film formed on a same layer as a layer of an anode edge cover of the light-emitting element layer in the bending section.

Eighteenth Aspect

The display device according to the ninth aspect is such that, for example, the fourth wiring line is formed on a same layer as a layer of the first wiring line and the second wiring line.

Nineteenth Aspect

The display device according to any one of the first to eighteenth aspects is such that, for example, the light-emitting element layer is of a top-emitting type, and a bend at the bending section causes the terminal disposed on a lower side to connect to an electronic circuit board.

Twentieth Aspect

A manufacturing method for a display device including a resin layer, a TFT layer being an upper layer with respect to the resin layer, and a light-emitting element layer being an upper layer with respect to the TFT layer, wherein a bending section is provided on a peripheral edge, includes forming a first wiring line and a second wiring line configured to be positioned on both sides of the bending section, forming a third wiring line configured to pass through the bending section and be electrically connected with each of the first wiring line and the second wiring line, and forming a fourth wiring line configured to be formed in a layer different from a layer of the third wiring line and be electrically connected with each of the first wiring line and the second wiring line.

Twenty-First Aspect

A manufacturing apparatus for a display device including a resin layer, a TFT layer being an upper layer with respect to the resin layer, and a light-emitting element layer being an upper layer with respect to the TFT layer, wherein a bending section is provided on a peripheral edge, is configured to execute forming a first wiring line and a second wiring line configured to be positioned on both sides of the bending section, forming a third wiring line configured to pass through the bending section and be electrically connected with each of the first wiring line and the second wiring line, and forming a fourth wiring line configured to be formed in a layer different from a layer of the third wiring line and be electrically connected with each of the first wiring line and the second wiring line.

REFERENCE SIGNS LIST

2 Display device
3 Barrier layer
4 TFT layer
5 Light emitting-element layer
6 Sealing layer
12 Resin layer
16, 18, 20 Inorganic insulating film
21 Flattening film
23 Bank (Anode edge cover)
23z Organic insulating film
24 EL layer
70 Display device manufacturing apparatus
EZ Reinforcing film
TM Terminal
TW Terminal wiring line

The invention claimed is:

1. A display device including a resin layer, a TFT layer being an upper layer with respect to the resin layer, and a light-emitting element layer being an upper layer with respect to the TFT layer, wherein a bending section is provided on a peripheral edge, the display device comprising:
a terminal wiring line connected to a terminal of the TFT layer and passing through the bending section, wherein the terminal wiring line includes:
a first wiring line and a second wiring line sandwiching the bending section, the first wiring line being positioned on a first side of the bending section and the second wiring line being positioned on a second side of the bending section, the second side being opposite to the first side,
a third wiring line passing through the bending section and electrically connected with each of the first wiring line and the second wiring line, and
a fourth wiring line defined in a layer different from a layer of the third wiring line and electrically connected with each of the first wiring line and the second wiring line, and
the fourth wiring line is: (i) in direct contact with the first wiring line and the third wiring line, (ii) sandwiched between the first wiring line and the third wiring line on the first side, (iii) in direct contact with the second wiring line and the third wiring line, and (iv) sandwiched between the second wiring line and the third wiring line on the second side.

2. The display device according to claim 1, wherein the fourth wiring line is superimposed on the third wiring line via a flexible insulating film.

3. The display device according to claim 2, wherein
a plurality of inorganic insulating films is included in the TFT layer, and
the plurality of inorganic insulating films is penetrated in the bending section.

4. The display device according to claim 3, further comprising:
a barrier layer between the resin layer and the TFT layer, wherein
a first slit formed by penetrating the barrier layer is provided in the bending section.

5. The display device according to claim 4, wherein
a second slit formed by penetrating the plurality of inorganic insulating films overlaps the first slit, and
a reinforcing film fills the first slit and the second slit.

6. The display device according to claim 5, wherein the third wiring line is sandwiched between the reinforcing film and a flattening film serving as an underlayer of the light-emitting element layer in the bending section.

7. The display device according to claim 6, wherein the reinforcing film and the flattening film are formed of an identical organic material.

8. The display device according to claim 6, wherein the third wiring line is formed in a same layer as a layer of the terminal.

9. The display device according to claim 8, wherein the first wiring line and the second wiring line are formed in a same layer as a layer of a gate electrode included in the TFT layer.

10. The display device according to claim 9, wherein the fourth wiring line is formed on an upper layer with respect to the gate electrode in the TFT layer and on a lower layer with respect to the terminal.

11. The display device according to claim 10, wherein the fourth wiring line passes through the first slit and the second slit.

12. The display device according to claim 11, wherein the fourth wiring line and the resin layer are in contact with each other in the first slit.

13. The display device according to claim 12, wherein the fourth wiring line is sandwiched between the resin layer and the reinforcing film in the bending section.

14. The display device according to claim 11, wherein
an opening of the first slit is disposed on an inside of an opening of the second slit in a planar view, and
the fourth wiring line is in contact with the barrier layer in the second slit.

15. The display device according to claim 11, wherein
the plurality of inorganic insulating films includes a first insulating film, a second insulating film, and a third insulating film,
the third wiring line is formed on a same layer as a layer of a source electrode of the TFT layer,
the first insulating film is formed on an upper layer with respect to the barrier layer and on a lower layer with respect to the first wiring line and the second wiring line,
the second insulating film is formed on an upper layer with respect to the first wiring line and the second wiring line and on a lower layer with respect to the fourth wiring line,
the third insulating film is formed on an upper layer with respect to the fourth wiring line and on a lower layer with respect to the third wiring line,
the first wiring line and the fourth wiring line come in contact with each other by one of two contact holes formed on the second insulating film on both sides of the bending section, and the second wiring line and the fourth wiring line come in contact with each other by the other of the two contact holes, and
the third wiring line and the fourth wiring line come in contact with each other by both two contact holes formed on the third insulating film on both sides of the bending section.

16. The display device according to claim 9, wherein the fourth wiring line is formed on a same layer as a layer of a lower-side electrode included in the light-emitting element layer.

17. The display device according to claim 16, wherein the fourth wiring line is sandwiched between the flattening film and an insulating film formed on a same layer as a layer of an anode edge cover of the light-emitting element layer in the bending section.

18. The display device according to claim 9, wherein the fourth wiring line is formed on a same layer as a layer of the first wiring line and the second wiring line.

19. The display device according to claim 1, wherein
the light-emitting element layer is of a top-emitting type, and
a bend at the bending section causes the terminal disposed on a lower side to connect to an electronic circuit board.

20. A manufacturing method for a display device including a resin layer, a TFT layer being an upper layer with respect to the resin layer, and a light-emitting element layer being an upper layer with respect to the TFT layer, wherein a bending section is provided on a peripheral edge, the method comprising:
forming a first wiring line and a second wiring line sandwiching the bending section, the first wiring line being positioned on a first side of the bending section, the second wiring line being positioned on a second side of the bending section, the second side being opposite the first side;
forming a third wiring line passing through the bending section and electrically connected with each of the first wiring line and the second wiring line; and
forming a fourth wiring line in a layer different from a layer of the third wiring line and electrically connected with each of the first wiring line and the second wiring line through direct contact with the first wiring line and the third wiring line to be sandwiched between the first wiring line and the third wiring line on the first side and through direct contact with the second wiring line and the third wiring line to be sandwiched between the second wiring line and the third wiring line on the second side.

* * * * *